(12) United States Patent
Riordon et al.

(10) Patent No.: US 8,569,157 B2
(45) Date of Patent: *Oct. 29, 2013

(54) STEPPED MASKING FOR PATTERNED IMPLANTATION

(75) Inventors: Benjamin B. Riordon, Newburyport, MA (US); Nicholas P. T. Bateman, Reading, MA (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/442,571

(22) Filed: Apr. 9, 2012

(65) Prior Publication Data

US 2012/0196430 A1      Aug. 2, 2012

Related U.S. Application Data

(63) Continuation of application No. 12/906,369, filed on Oct. 18, 2010, now Pat. No. 8,173,527.

(60) Provisional application No. 61/252,744, filed on Oct. 19, 2009.

(51) Int. Cl.
 *H01L 21/425*      (2006.01)

(52) U.S. Cl.
 USPC .................................. 438/531; 257/E21.644

(58) Field of Classification Search
 USPC ......... 438/194, 231, 232, 252, 301, 527, 531;
 257/E21.058, E21.346, E21.618,
 257/E21.619, E21.63, E21.633, E21.634,
 257/E21.637, E21.644
 See application file for complete search history.

(56) References Cited

U.S. PATENT DOCUMENTS 8,173,527 B2 *    5/2012  Riordon et al. ............... 438/531

* cited by examiner

*Primary Examiner* — William D Coleman
*Assistant Examiner* — Su Kim

(57) ABSTRACT

An improved method of moving a mask to perform a pattern implant of a substrate is disclosed. The mask has a plurality of apertures, and is placed between the ion source and the substrate. After the substrate is exposed to the ion beam, the mask is indexed to a new position relative to the substrate and a subsequent implant step is performed. Through the selection of the aperture size and shape, the index distance and the number of implant steps, a variety of implant patterns may be created. In some embodiments, the implant pattern includes heavily doped horizontal stripes with lighter doped regions between the stripes. In some embodiments, the implant pattern includes a grid of heavily doped regions. In other embodiments, the implant pattern is suitable for use with a bus-bar structure.

20 Claims, 19 Drawing Sheets

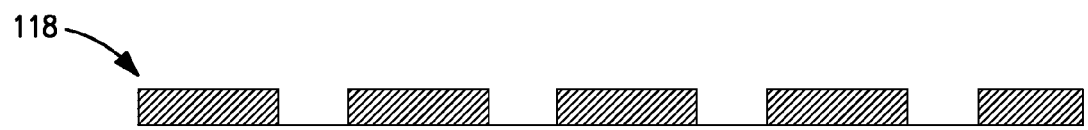
D
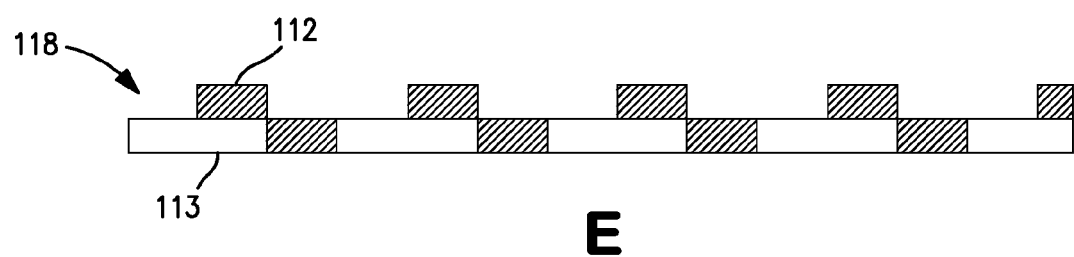
E
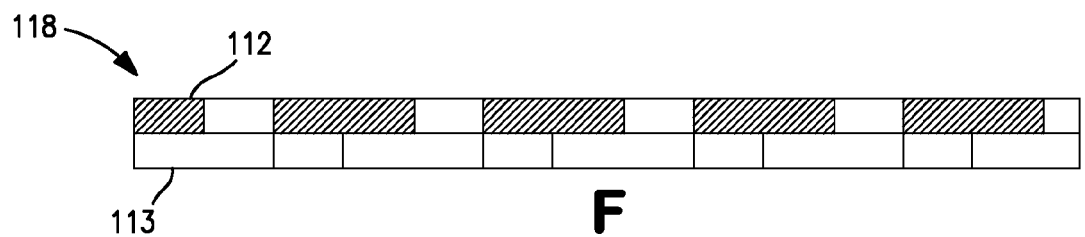
F
FIG. 7

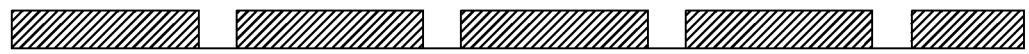
D
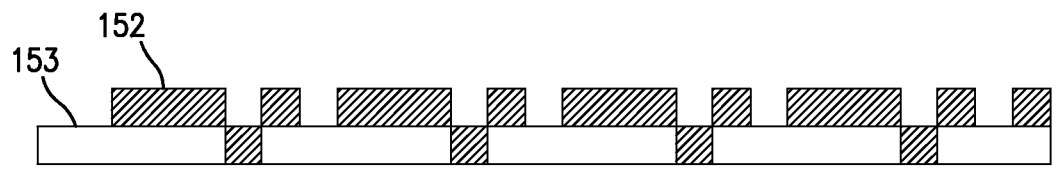
E
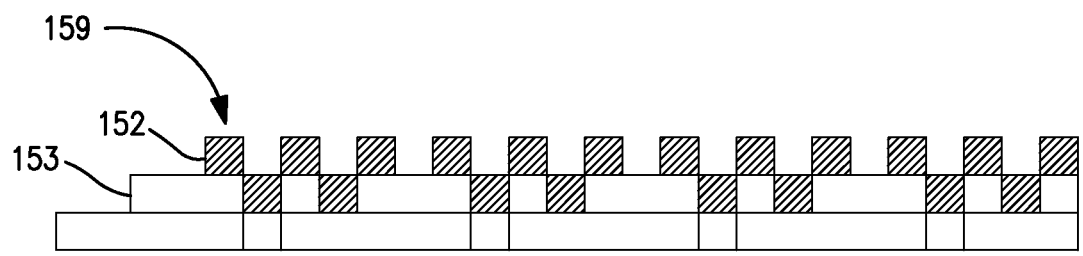
F
FIG. 11

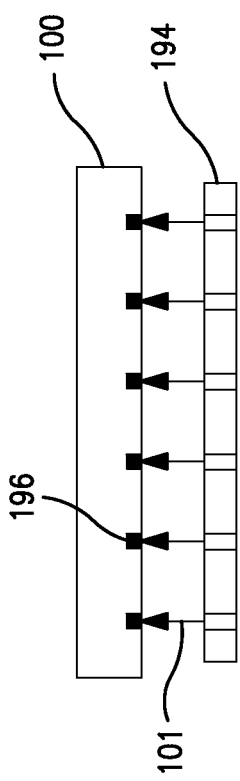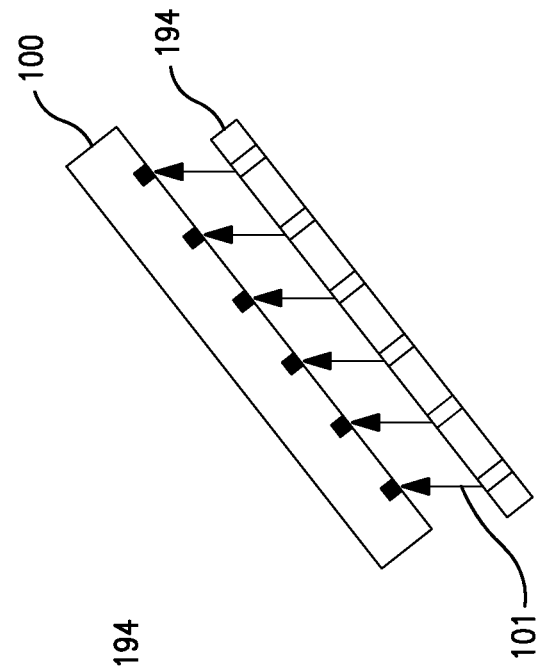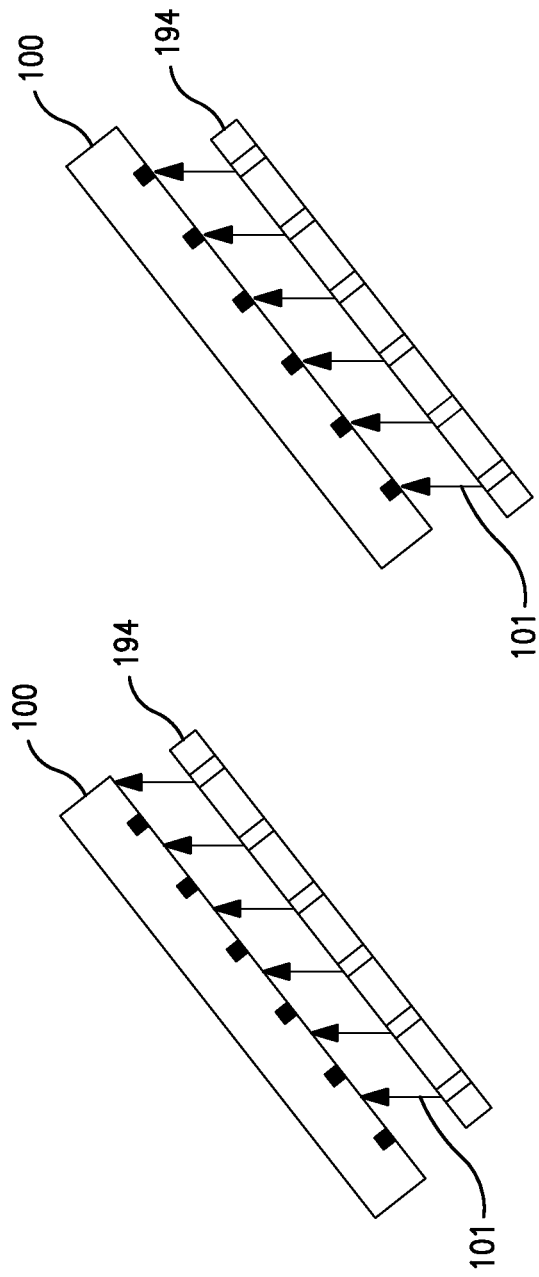

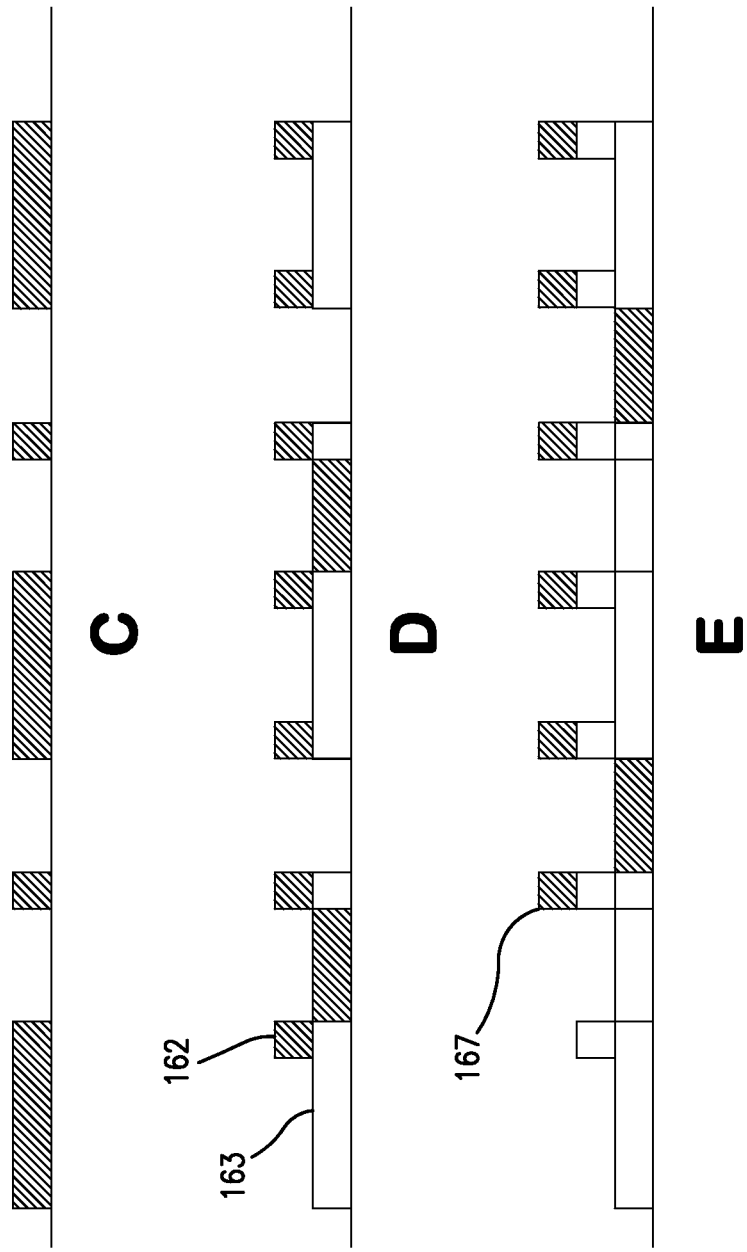

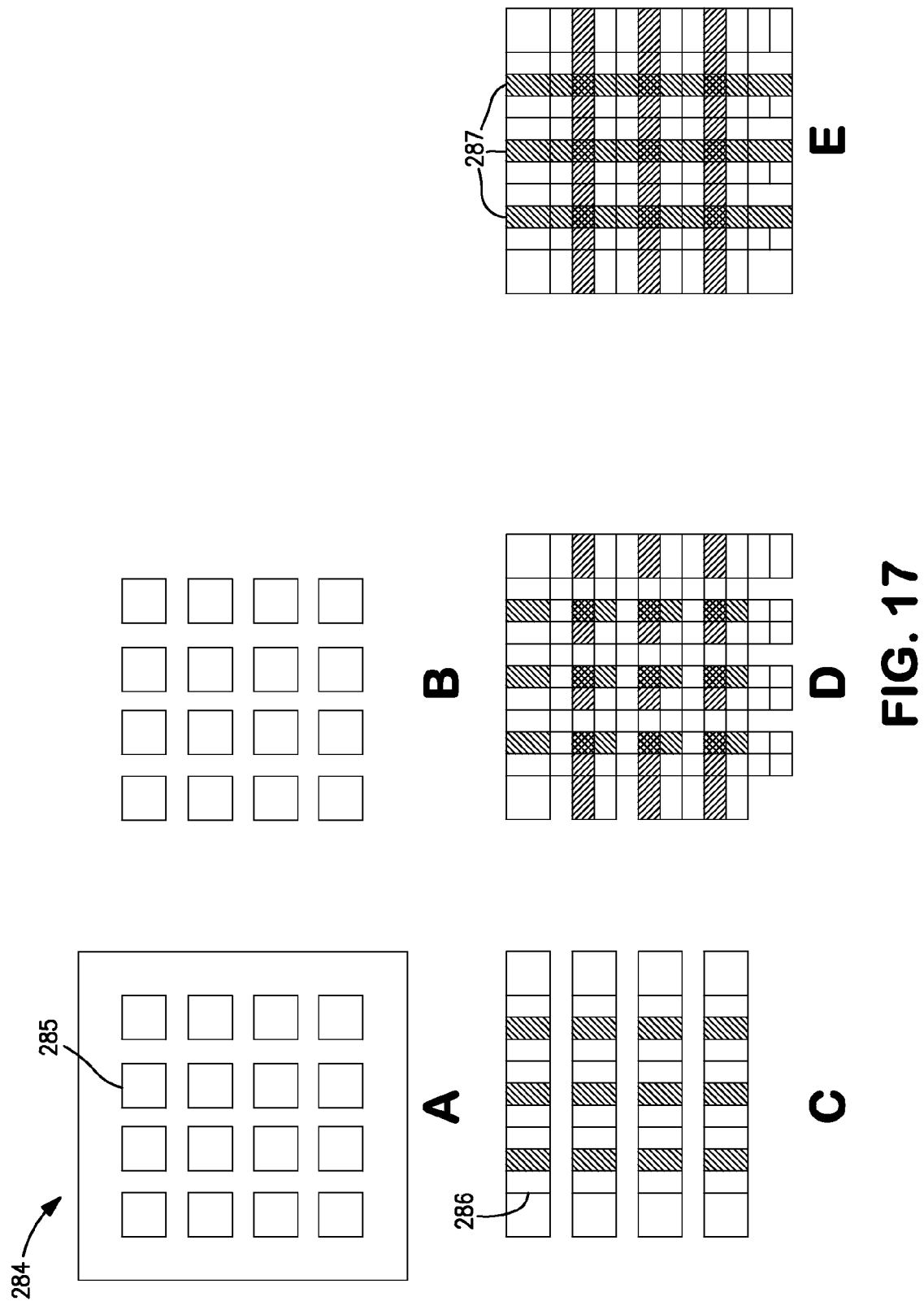

STEPPED MASKING FOR PATTERNED IMPLANTATION

This application is a continuation of U.S. patent application Ser. No. 12/906,369, filed Oct. 18, 2010, which claims priority of U.S. Provisional Patent Application Ser. No. 61/252,744, filed Oct. 19, 2009, the disclosures of which are incorporated herein by reference in their entirety.

FIELD

This invention relates to ion implantation through a mask and, more particularly, to a method of moving a mask to perform a patterned implant of a substrate.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Doping may improve efficiency of solar cells. FIG. 1 is a cross-sectional view of a selective emitter solar cell 210. It may increase efficiency (e.g. the percentage of power converted and collected when a solar cell is connected to an electrical circuit) of a solar cell 210 to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across. FIG. 2 is a cross-sectional view of an interdigitated back contact (IBC) solar cell 220. In the IBC solar cell, the junction is on the back of the solar cell 220. The doping pattern is alternating p-type and n-type dopant regions in this particular embodiment. The p+ emitter 203 and the n+ back surface field 204 may be doped. This doping may enable the junction in the IBC solar cell to function or have increased efficiency.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Use of photoresist, however, would add an extra cost to solar cell production because extra process steps are involved. Other hard masks on the solar cell surface likewise are expensive and require extra steps.

Implanting a substrate through a mask, such as a shadow or proximity mask, has drawbacks. First, the throughput of the ion implanter is reduced if the substrate is implanted through a mask because some of the ion beam is blocked. Second, masks are difficult to cost-effectively manufacture, especially with small aperture sizes. Third, the mask itself may be fragile due to the size of the apertures. If supports or solid mask portions between the apertures weaken, then the aperture may not align to the desired regions of the substrate. Poor implant region placement, poor dimensional tolerance, thermal expansion, or damage to the mask may result during implantation. Fourth, the use of a mask produces regions of two doses: a first region having the implant dose and a second region having zero dose. It may be desirable to have a more variable level of dosing in alternating striped patterns for some applications. However, to do a blanket implant across an entire face of a substrate and then a selective implant using a mask requires repositioning of either the mask or substrate. This reduces throughput of the implanter, adds complexity to the implanter, and reduces the fidelity of the implant pattern. Accordingly, there is a need in the art for an improved method of implanting through a mask and, more particularly, a method of moving a mask to perform a patterned implant of a substrate.

SUMMARY

An improved method of moving a mask to perform a pattern implant of a substrate is disclosed. The mask has a plurality of apertures, and is placed between the ion source and the substrate. After the substrate is exposed to the ion beam, the mask is indexed to a new position relative to the substrate and a subsequent implant step is performed. Through the selection of the aperture size and shape, the index distance and the number of implant steps, a variety of implant patterns may be created. In some embodiments, the implant pattern includes heavily doped horizontal stripes with lighter doped regions between the stripes. In some embodiments, the implant pattern includes a grid of heavily doped regions. In other embodiments, the implant pattern is suitable for use with a bus-bar structure.

BRIEF DESCRIPTION OF THE DRAWINGS

For a better understanding of the present disclosure, reference is made to the accompanying drawings, which are incorporated herein by reference and in which:

FIGS. 15A-C show an embodiment using angled implants;

FIG. 17A-E is an embodiment showing a mask that can be translated in two dimensions.

DETAILED DESCRIPTION

Embodiments of this system are described herein in connection with solar cells. However, the embodiments of this system can be used with, for example, semiconductor substrates or flat panels. Thus, the invention is not limited to the specific embodiments described below.

Figure 3:
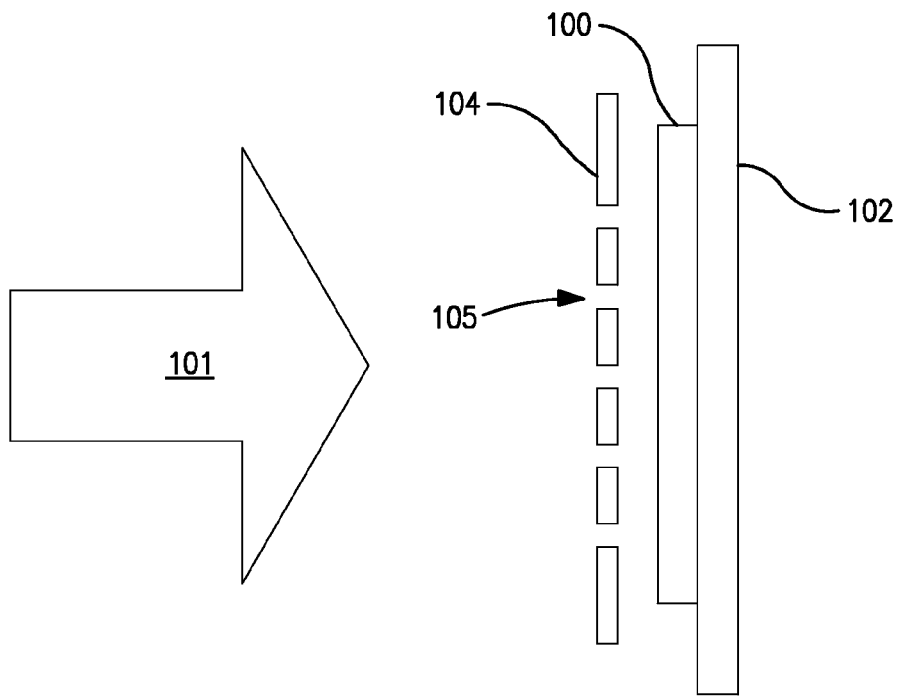
FIG. 3 is a cross-sectional view of implantation through a mask.

FIG. 3 is a cross-sectional view of implantation through a mask. When a specific pattern of ion implantation in a substrate 100 is desired, a mask 104 may be used. This mask 104 may be a shadow or proximity mask. The mask 104 is placed in front of a substrate 100 in the path of an ion beam 101. The substrate 100 may be, for example, a solar cell. The substrate 100 may be placed on a platen 102, which may use electrostatic or physical force to retain the substrate 100. The mask 104 has apertures 105 that correspond to the desired pattern of ion implantation in the substrate 100. The apertures 105 may be stripes, dots, or other shapes. Use of the mask 104 eliminates process steps, such as silkscreening or lithography, required for other ion implantation techniques.

Figure 4:
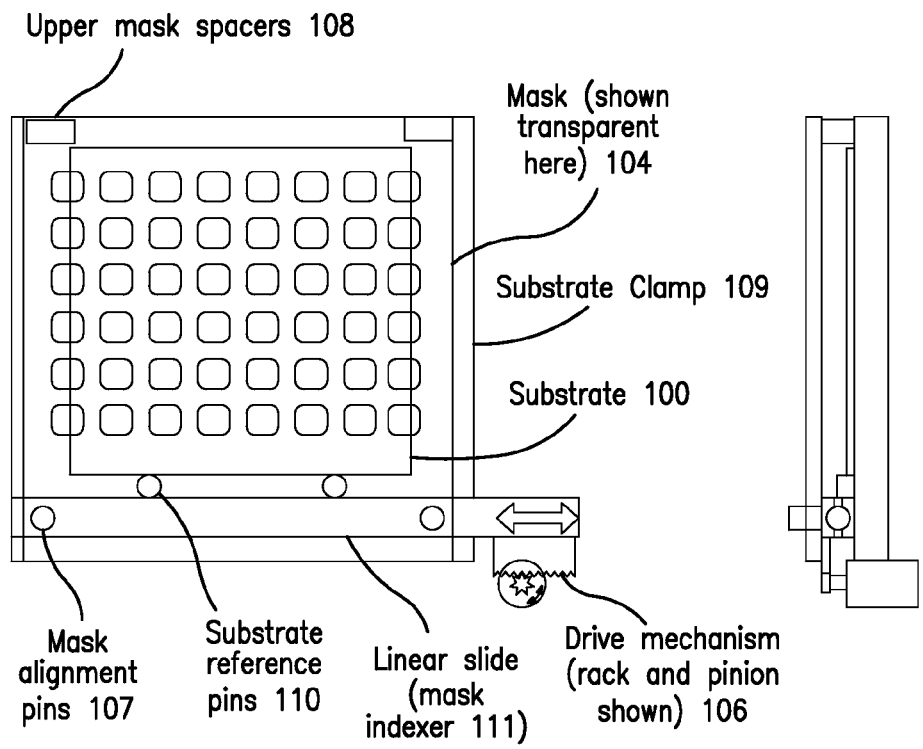
FIG. 4 is a front plan and cross-sectional view of an embodiment of a mask.

FIG. 4 is a front plan and cross-sectional view of an embodiment of a mask. The mask 104 is positioned in front of the substrate 100. After each implant pass, the mask 104 is indexed or translated to a new position. The apertures 105 of the mask 104 are designed so that a portion of the total desired dose for the target area has been applied to the substrate 100 after each pass. Apertures 105 of the mask 104 are spaced along the indexed length to vary the dose in each region. The mask 104 is mounted to a drive mechanism 106 through mask locating features, such as mask alignment pins 107. The mask 104 is supported by mask spacers 108 on the side opposite the drive mechanism 106 to maintain parallelism with the substrate 100. The substrate clamp 109, which is an example of the platen 102, may be electrostatic or mechanical. The substrate 100 is disposed on the substrate clamp 109 using ground pins in one embodiment. The mask drive mechanism 106 may be positioned using ground pins. It may have a working range equal to the mask pattern length. The drive mechanism 106 may be a rack and pinion mechanism or any other drive known to those skilled in the art.

In an alternate embodiment to the reference pins 110 illustrated in FIG. 4, the substrate 100 can be directly registered or aligned to the mask 104 by sliding an edge of the substrate 100 onto a mask feature prior to clamping. This can register or align the substrate 100 because the mask 104 can be positioned directly on the scanning mechanism 111. The mask 104 need not move away from the registration surface to move to a new implant position. This may improve repeatability of the substrate registration.

Figure 12:
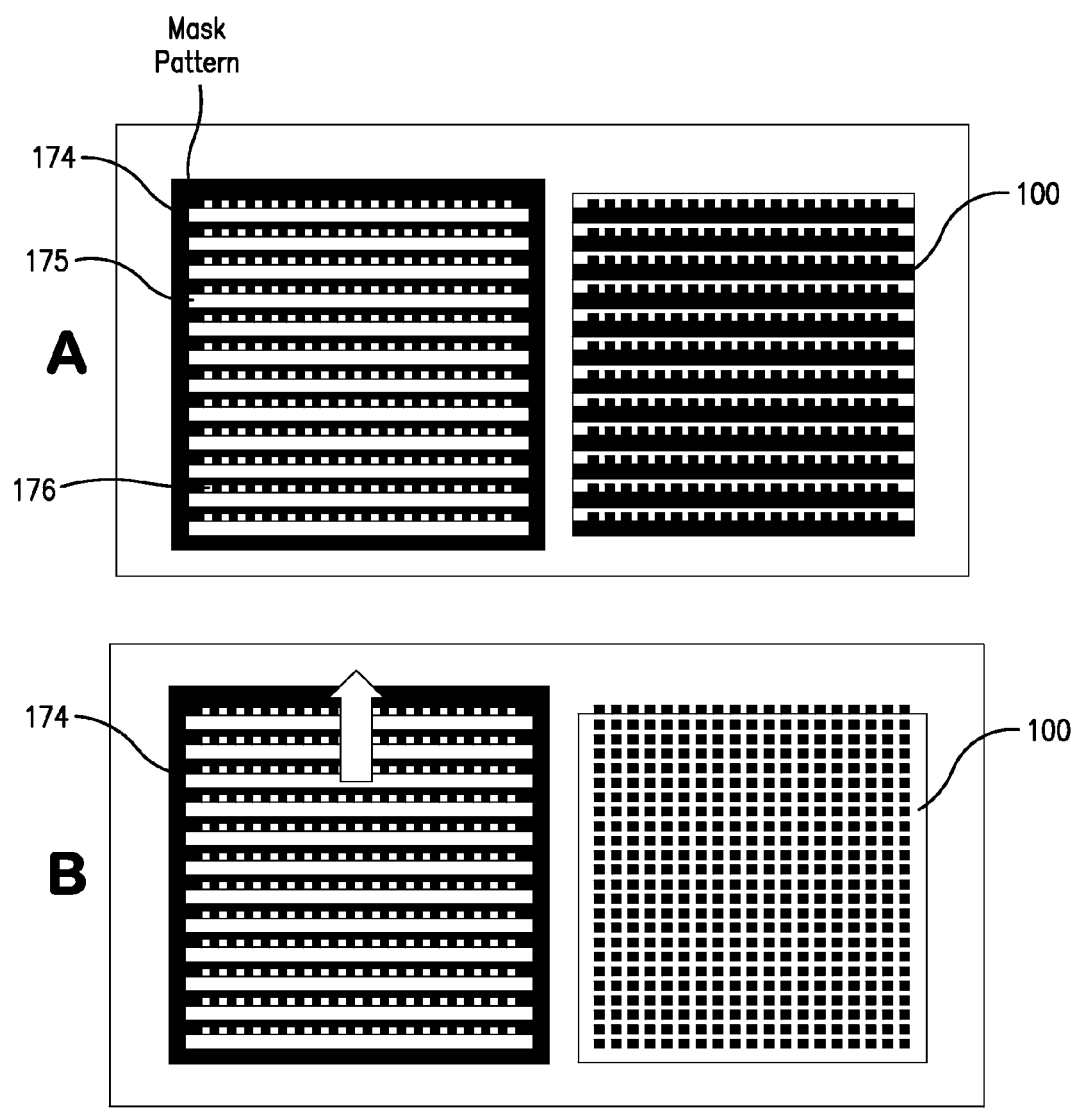
FIGS. 12A-B are embodiments of a mask with resulting implant patterns.
Figure 13:
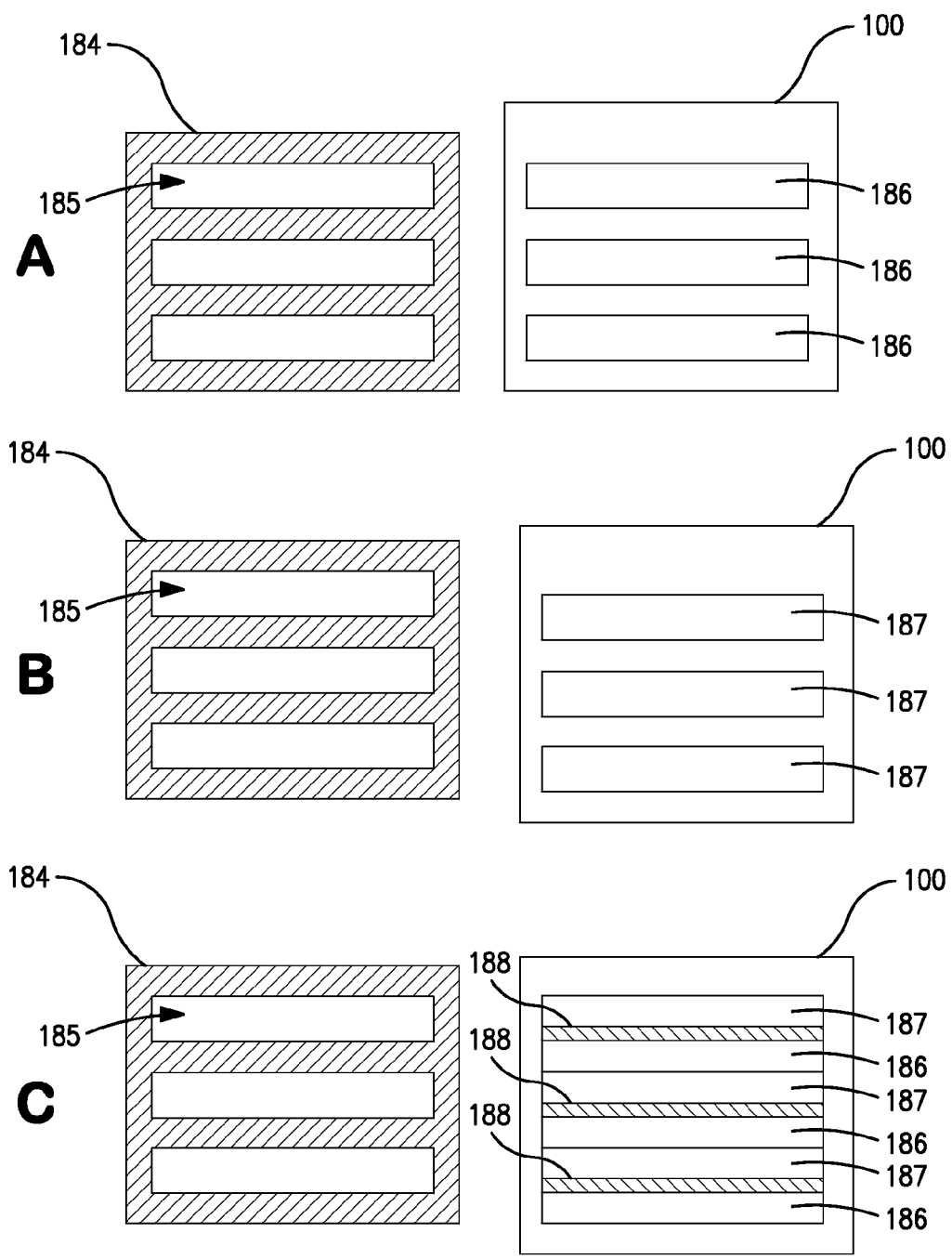
FIGS. 13A-C are an embodiment of a stepped mask and resulting implant pattern.
Figure 14:
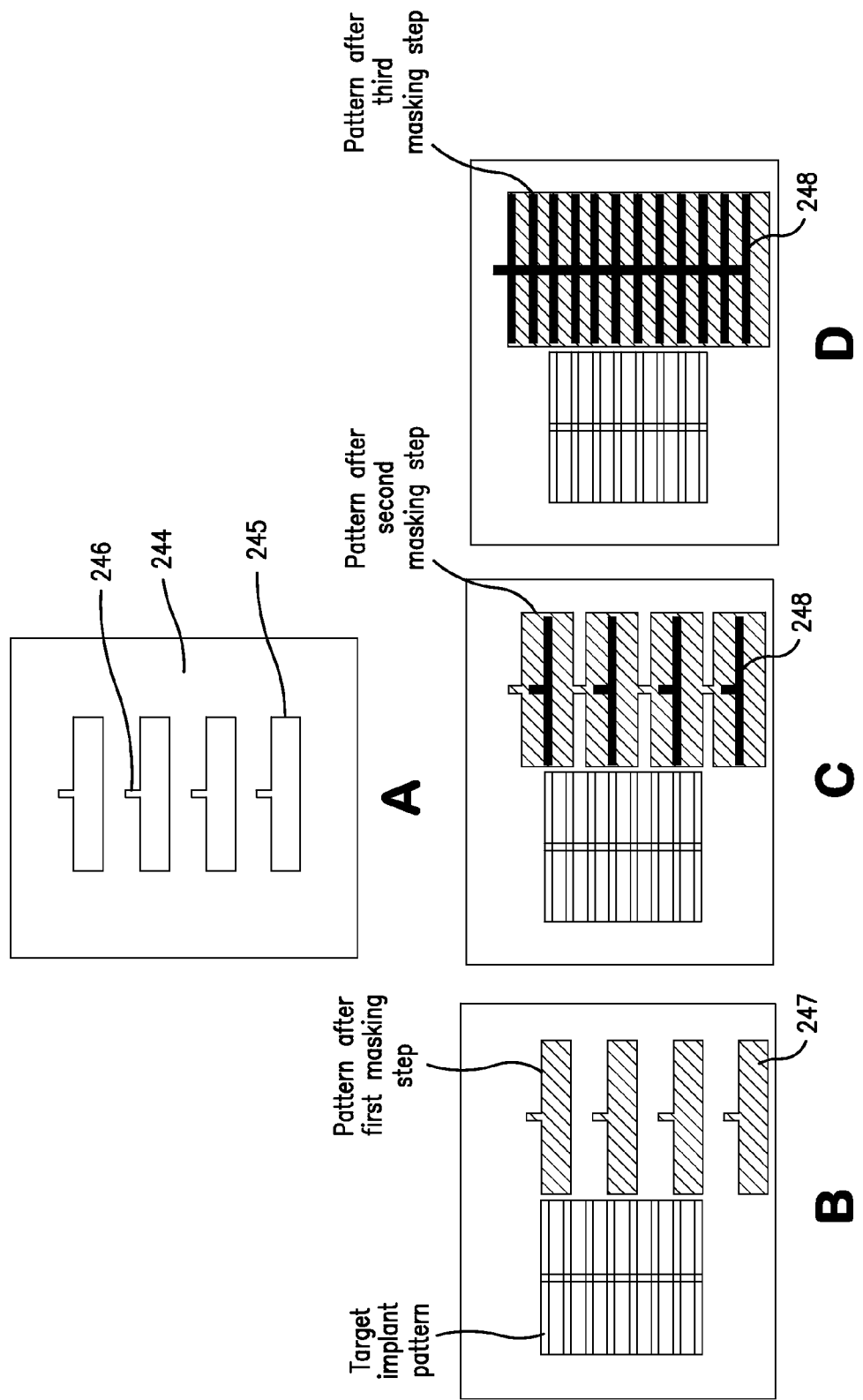
FIGS. 14A-D are an embodiment of a stepped mask implant of bus-bars.

The apertures in the mask 104 may be any shape, such as squares, as shown in FIG. 4, or rectangles, as shown in FIG. 13. Other shapes, such as those shown in FIGS. 12 and 14 can also be used. Each aperture is said to have a width (the horizontal dimension) and a height (vertical dimension). In some embodiments, the mask is indexed in the horizontal (or lateral) direction, while in other embodiments, the mask is indexed in the vertical direction. In other embodiments, as described in FIG. 17, the mask is indexed in two directions. The size and shape of the aperture, the spacing between apertures, the direction and magnitude of the indexing distance, and the number of implant steps all contribute to determining the ultimate implant pattern.

FIGS. 5A-D illustrate a first sequential scanning method. While scanning the substrate 100 is illustrated, the ion beam 101 may be scanned instead of or in conjunction with substrate scanning. The substrate 100 is implanted through the mask 104. Then the mask 104 and substrate 100 are translated with respect to one another (FIGS. 5B-C) and implanted again in a second position. Such a sequential scan enables the entire substrate 100 to be implanted with a desired pattern.

In some embodiments, such as shown in FIGS. 5A-D, the translation of the mask may occur when the substrate has moved out of the ion beam 101, so as not be inadvertently implant ions during the movement. For example, in FIG. 5A, the mask 104 is held in a first position relative to the substrate 100, as the ion beam 101 is used to implant ions into the substrate 100. After the substrate 100 and mask 104 have moved beyond the ion beam (FIG. 5B), the mask 104 is indexed to a second position relative to the substrate 100. The substrate 100 and mask 104 are then moved through the ion beam 101, as shown in FIG. 5C. The mask 104 is then moved relative to the substrate 100 to a third position, as shown in FIG. 5D. To increase the efficiency of the operation, the mask 104 may be translated when the substrate is above the ion beam 101, as shown in FIG. 5B, or is below the ion beam, as shown in FIG. 5D. The pattern may be intended to be applied as a step function.

In other embodiments, the mask 104 may be moved while the substrate 100 is traveling through the ion beam 101. This integrated motion (i.e. both the mask 104 and the substrate 100 moving simultaneously in different directions) tends to blur the pattern onto the substrate 100. In this embodiment, the pattern may be any profile that is integral across the horizontal direction.

In one specific instance, at least an implant of over 50% of the surface of the substrate 100 is performed with a first dose. A smaller percentage of the substrate 100 then may be implanted with a higher second dose.

Using the sequential scanning method shown in FIG. 5A-D will produce a substrate 100 having a plurality of horizontal stripes which have been implanted, interspersed with horizontal stripes that have not been implanted. In this embodiment of FIG. 5, the mask 104 may moved laterally (i.e. horizontally) by a distance equal to the spacing between two adjacent apertures 104. The distance that the mask 104 is moved relative to the substrate 100 is known as the index distance. In a mask where the width of the apertures is equal to the width of the spacing between apertures, this will create the desired striped pattern in 2 passes. The first pass will create a doped checkerboard pattern. The second pass will fill in the spaces between the doped squares, thereby converting them into stripes.

Figure 5:
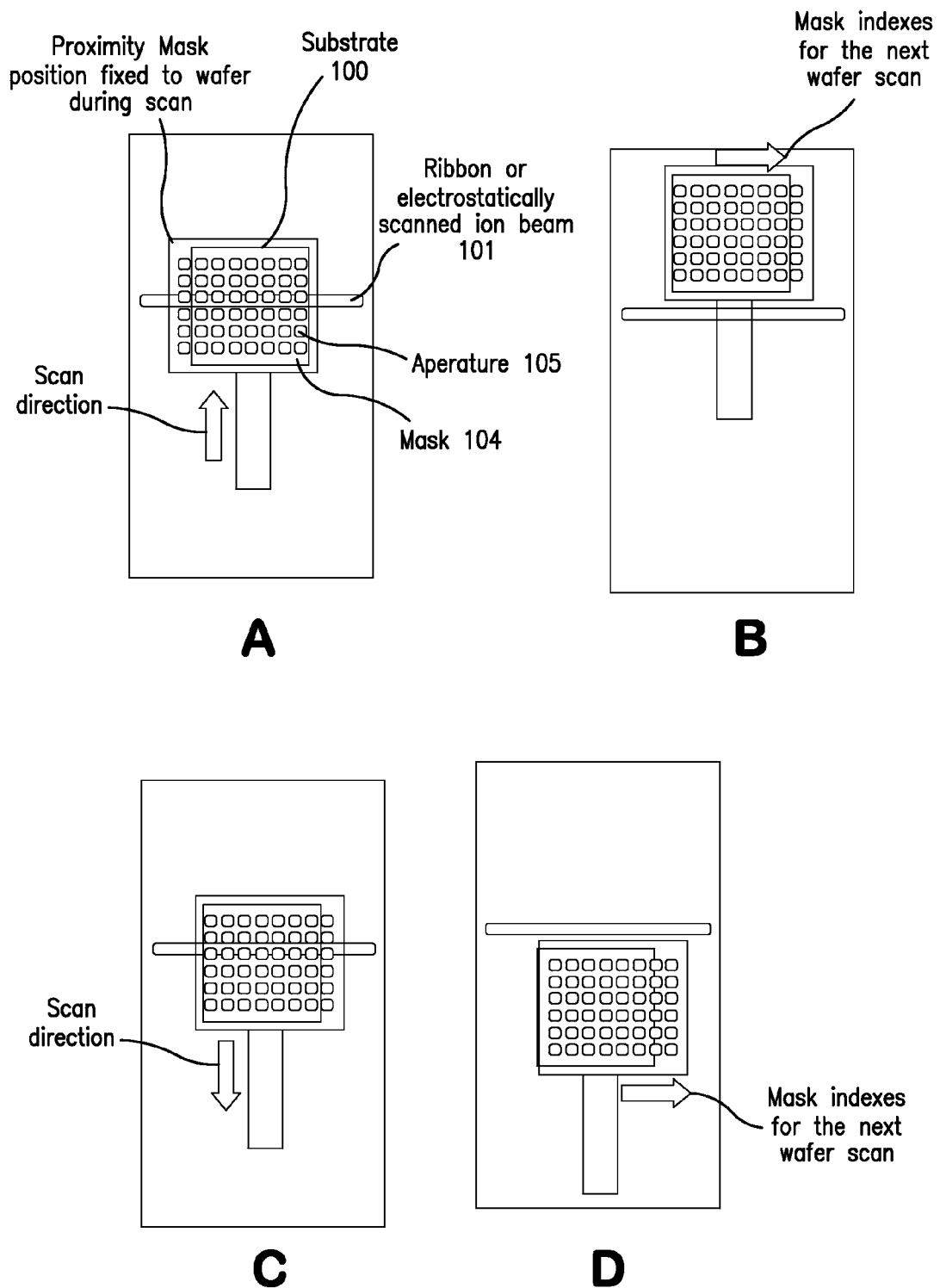
FIGS. 5A-D illustrate a first sequential scanning method.

One advantage of this technique is increased structural integrity of the mask. A mask having long apertures (in the form of stripes) may be more brittle and susceptible to fatigue and failure. The mask 104 of FIG. 5 is reinforced since the apertures 105 are small compared to the amount of material in the mask.

Figure 6:
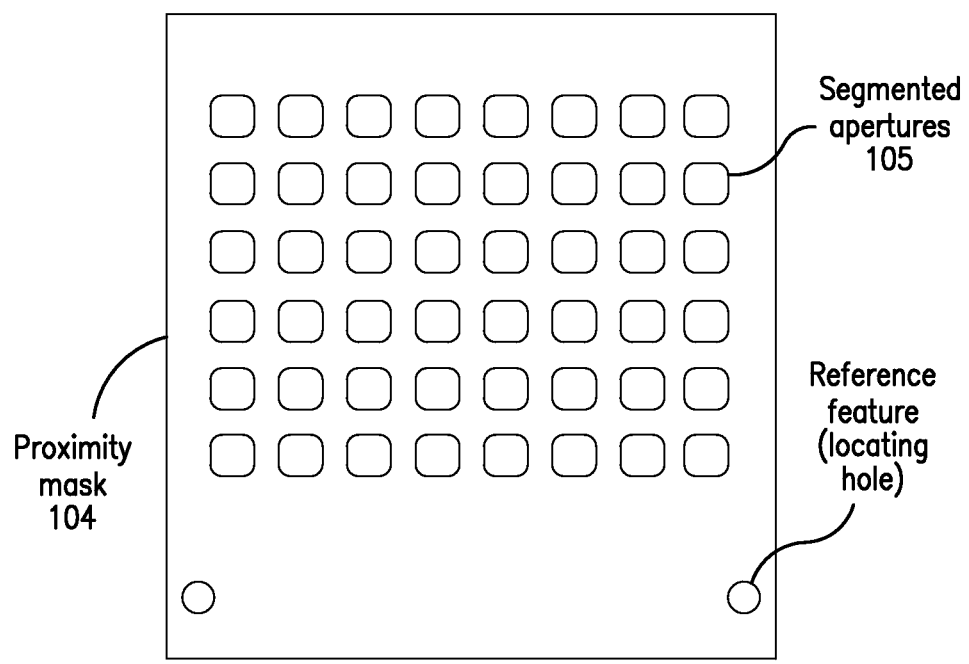
FIG. 6 is a front plan view of a single dose segmented mask.

FIG. 6 is a front plan view of a single dose segmented mask 104. As described above, a single dose, segmented mask implants a substrate 100 with a series of horizontal stripes through slots or apertures 105. Each implanted stripe will have the same dose, thus the term "single dose" mask. One characteristic of a mask is the length (or width) of the segmented aperture 105 compared to the length of the mask portions between adjacent segmented apertures 105. This proportion is referred to as the segment-shadow ratio. For example, a mask 104 designed to implant the striped region in six passes will have a segment-shadow ratio of 5:1. Thus, masks that have a greater segment-shadow ratio will require a larger number of passes to create a pattern with a uniform dose across the stripe. However, during each pass, more ions will be implanted due to the limited amount of shadowing from the mask. Masks with a lower segment-shadow ratio will be more structurally rigid and require fewer steps to complete a uniform striped implant.

Another example of an aperture shape is a rectangle. If a rectangle shape is used, abutting implant steps have minimal lack of dose uniformity. For production, rectangles with rounded corners, ovals, and bored holes could be used to reduce manufacturing costs and reduce thickness of the stripes.

Figure 7:
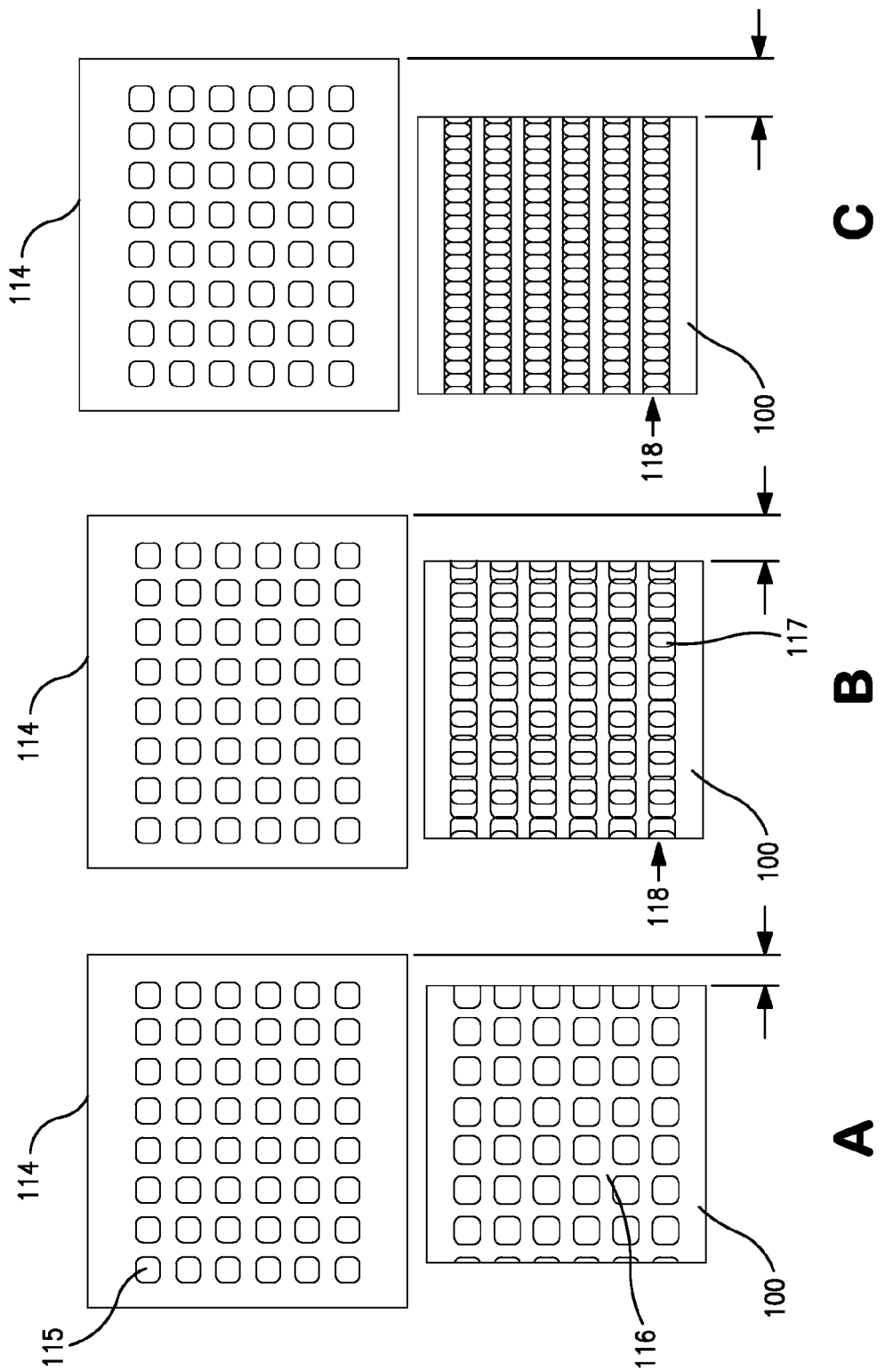
FIGS. 7A-F illustrate sequential scanning with a segment-shadow ratio of 2:1.

FIGS. 7A-C illustrate sequential scanning with a segment-shadow ratio of 2:1. A mask 114 with a segment-shadow ratio of 2:1 can create an implant pattern in a sequence of three implants with different positions (FIGS. 7A-C). In FIGS. 7A-C, the mask 114 is illustrated at the top and the resulting implant of FIGS. 7A-C on the substrate 100 is illustrated below, respectively. The mask 114 and/or the substrate 100 may translate in this particular embodiment. After the first pass (FIG. 7A), the substrate 100 has an implanted region that resembles a checkerboard pattern 116. After the second pass (FIG. 7B), the apertures 115 have moved to allow the regions between the checkerboard pattern to be implanted. However, portions 117 of the checkerboard pattern have received a second implant, and therefore, although a horizontal stripe 118 has been created, the dosing of that stripe is not yet uniform. After the third step (FIG. 7C), all portions of each horizontal stripe 118 have been exposed to the ion beam exactly twice, thereby creating a uniformly doped region.

FIG. 7D-F show a different representation of the implantation achieved during each step. FIG. 7D shows the implant pattern of horizontal stripe 118 after the first pass (FIG. 7A). At this point, ions have been implanted into the cross hatched regions 112. FIG. 7E shows the ion implantation after the second pass (FIG. 7B). Previously implanted regions 113 are now shown as white regions. Note that some regions have received two implants, which is denoted via the taller blocks. Other regions received their first ion implant, and therefore cross hatched regions 112 are shown at two different levels. FIG. 7F shows the ion implantation after the third pass (FIG. 7C). Note that all portions of the horizontal stripe 118 in substrate 100 have received exactly two doses of ion implantation.

Figure 8:
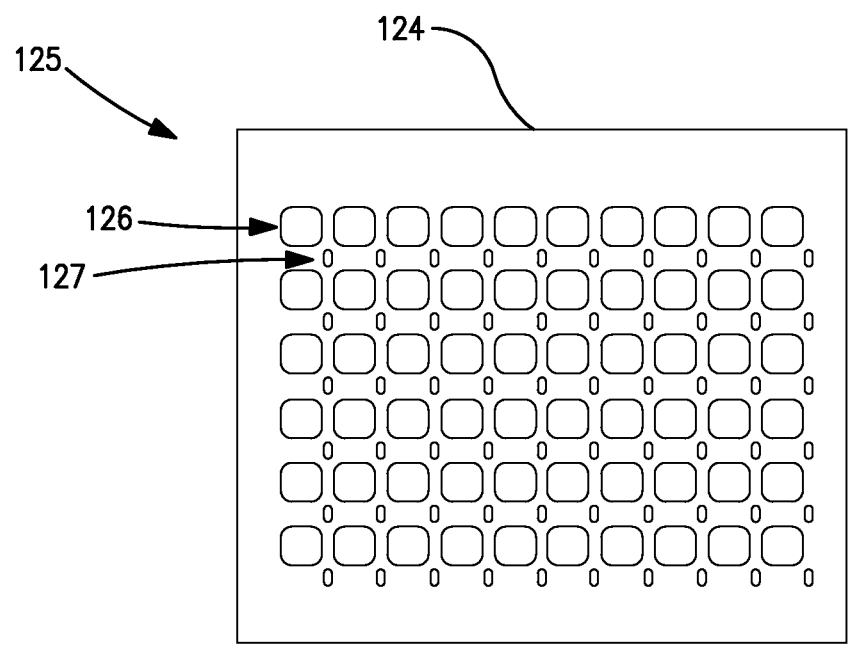
FIG. 8 is a front plan view of a multiple dose segmented mask.

FIG. 8 is a front plan view of a multiple dose segmented mask 124. The spacing of the segments of an orthogonally scanned mask may be varied to alter the applied dose of various stripes. Thus, a substrate with multiple doses can be implanted under a single mask without the need to perform a "blanket" implant over the entire face of a substrate (this "blanket" implant may not use a mask). In the embodiment illustrated in FIG. 8, the mask apertures 125 are divided into a series of alternating rows. The larger apertures 126 have a segment-shadow ratio of 4:1 while the smaller apertures 127 have a segment-shadow ratio of 1:4. The embodiment of this mask 124 gives more structural support to the areas between the apertures 105. The mask 124 will scan through five different positions to create a uniform stripe. This is illustrated in FIGS. 9A-E.

FIGS. 9A-E illustrate sequential scanning with the mask embodiment of FIG. 8. The mask scans through five different positions corresponding to FIGS. 9A-E. After the first pass (FIG. 9A), the large apertures 126 achieve a dose of 80% of the open-field dose and the small apertures 127 achieve a dose of 20% of the open field dose on the substrate 100. After a second pass (FIG. 9B), the horizontal stripes 128 formed by the large apertures 126 are formed, as the lateral movement of the mask 124 allows the regions between the large apertures 126 to be implanted. Note that the narrow stripes 129, which will be created by the small apertures 127, have not yet been completely formed. In fact, only ⅔ of those stripes 129 have been implanted. After each pass (FIG. 9C, 9D), the horizontal stripes 128 continue to increase the dose being applied to the region, while the narrow stripes 129 continue to form, with no overlap between passes. After the fifth pass, all portions of the horizontal stripes 128 have been implanted 4 times (or have received an 80% dose). In contrast, the portions of the horizontal stripes 129 have been implanted exactly once (which is equal to a 20% dose).

Figure 9:
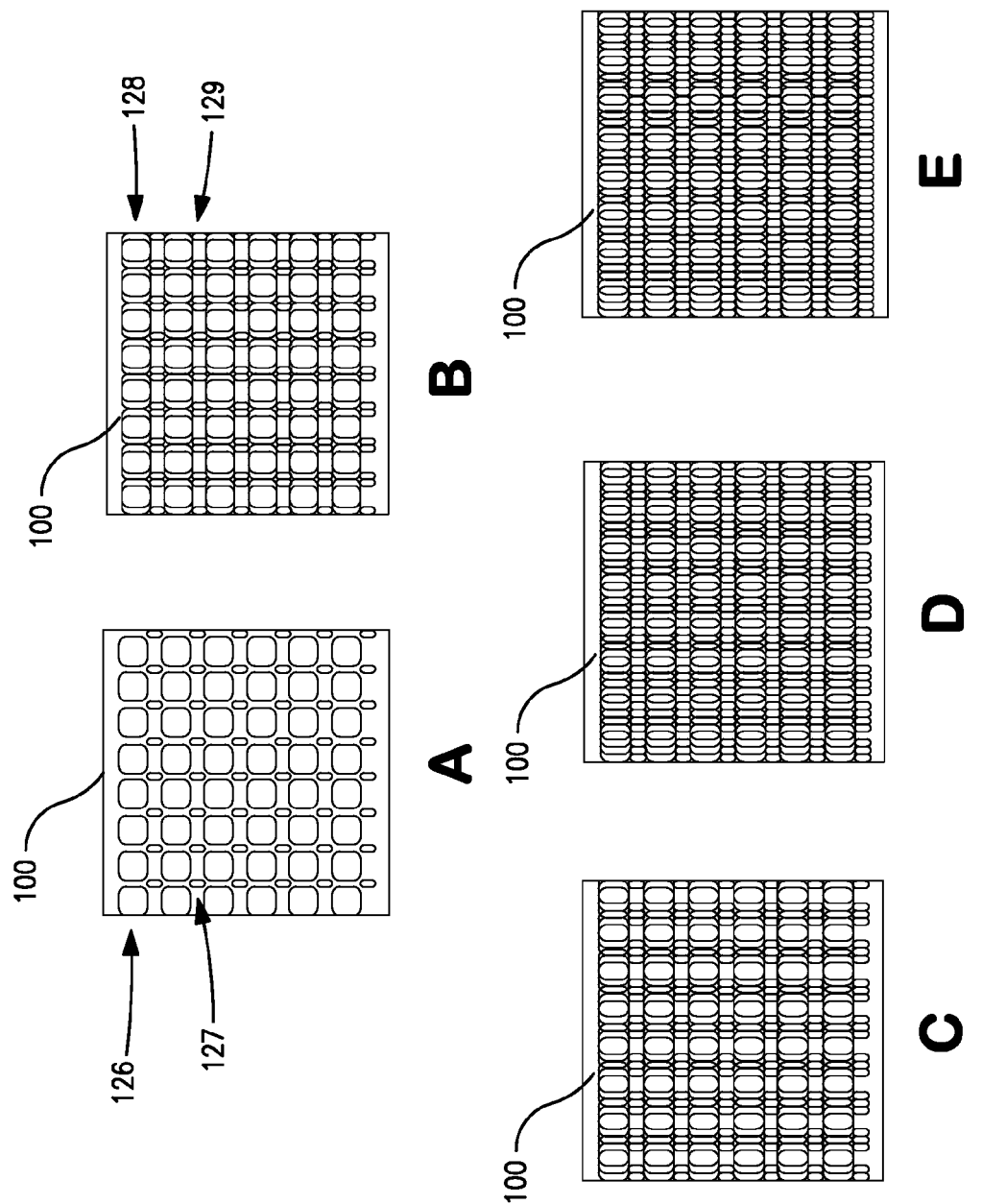
FIGS. 9A-J illustrate sequential scanning with the mask embodiment of FIG. 8.
Figure 9:
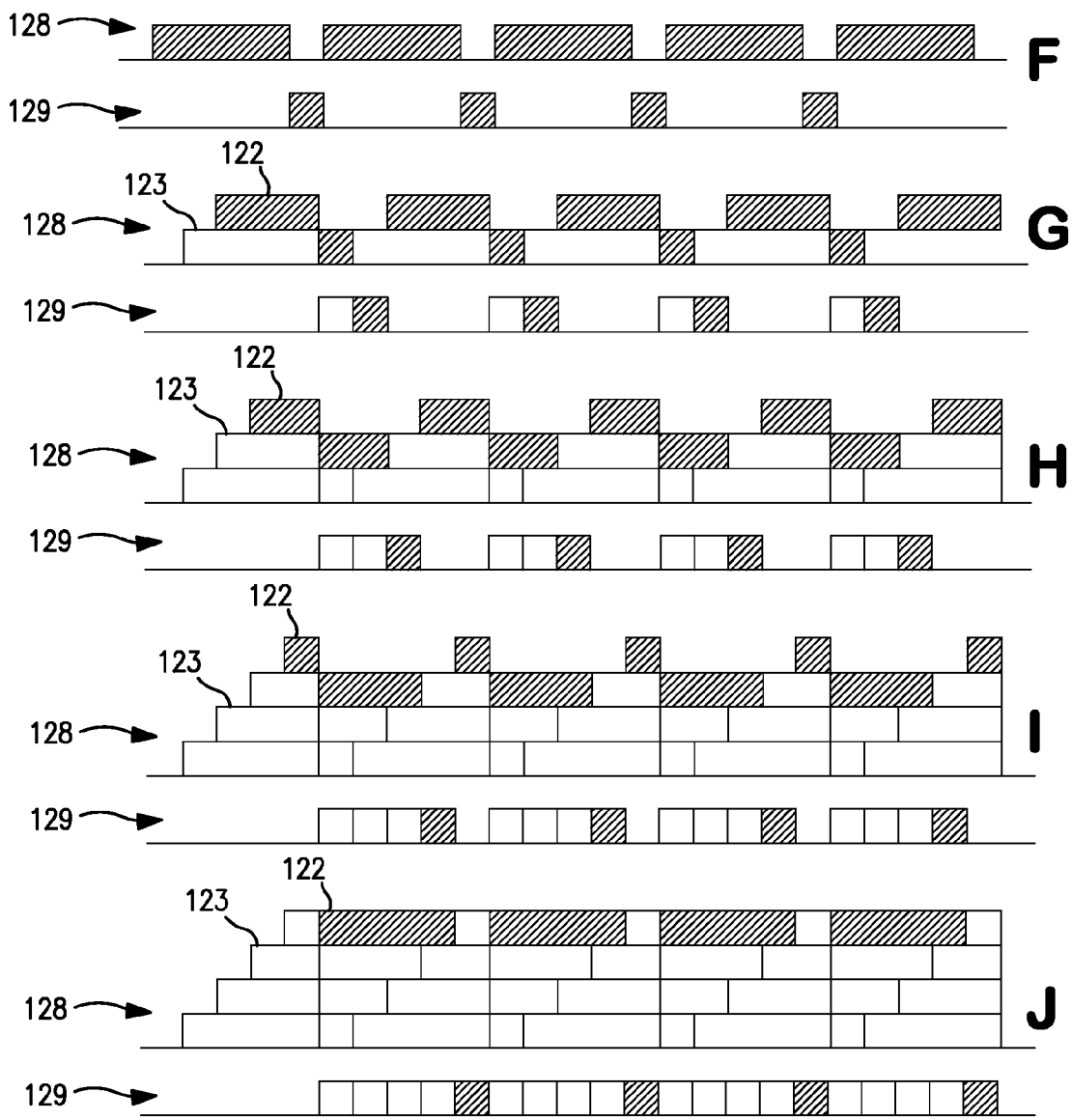

FIG. 9F-J show a second representation of these implant pattern. The upper line of each figure shows the implantation of the horizontal stripes 128, while the lower line of each figure shows the implantation of the narrow stripes 129. After the first implant (FIGS. 9A and 9F), most of the horizontal stripe 128 has been implanted, as denoted by cross hatch regions 122. However, only ⅓ of the harrow stripe 129 has been implanted. In FIG. 9G, the previous implants 123 are shown as white regions, while the new implants are shown as cross hatch regions 122. This process continues for the five implants. Note that after five implants, the upper line shows that all portions of the stripe 128 have been implanted exactly four times. In contrast, the lower line shows that the narrow stripes 129 are implanted only once during this process.

It should be noted that the disclosure is not limited to this multiple dose segmented mask 124. For example, there may be vertical spacing between the various rows of apertures, which can create horizontal stripes of un-implanted substrate. Additionally, the disclosure is not limited to only 2 different doses. Additional apertures, having different segment-shadow ratios can be used to create horizontal striped of various dose. Apertures can be interwoven to create non-step type patterns. If the dose profile is measured vertically, almost any target profile can be achieved if the apertures are arranged properly.

By comparison, a blanket implant across a substrate face followed by a single masked implant will each receive 100% dose in the target areas. Movement of the mask to perform the blanket implant, however, will reduce the throughput of the implanter.

In one particular embodiment, the mask and substrate may be rotated or tilted together with respect to the ion beam 101. In this embodiment, the segmented mask implants are indexed in a process similar to other embodiments described herein. The mask is located farther away from the substrate such that, for each indexed angle, the shadow is moved to a different location. The movement of the mask requires consideration of the effect that the tilt angle will have on the beam passing through the aperture. FIG. 15A shows a mask 194 and substrate 100 which is implanted by an orthogonal ion beam 101 to create implanted regions 196. FIG. 15B shows the same substrate 100 and mask 194, which have been tilted relative to the ion beam 101. Note that the ion beam 101 now implants different regions that those implanted by an orthogonal implant. To compensate for this, the mask 194 may need to initially be vertically or horizontally offset from its orthogonal position, based on the direction of the tilt angle, as shown in FIG. 15C. If the tilt angle remains constant during the implant, the index distance may be unchanged from that used for an orthogonal implant. If multiple implants are to be performed, using a plurality of tilt angles, the initial offset must be correctly calculated for each tilt angle. The dose uniformity along the implanted stripes is similar to the orthogonally indexed masked implants described herein.

In yet another embodiment, the index distance can be varied to achieve a particular distribution along the indexing direction. In other words, the distance which the mask is translated relative to the mask may not be constant. This may provide a non-uniform dose distribution on the substrate. The ratio of the indexed distance to the segment length can be increased to reduce the gaps between segments or increase the smoothness of the implanted feature. It may be desired to increase the indexing or steps to maintain the same dose. To do so, the scan speed may be increased to achieve a reduced dose per scan.

Figure 10:
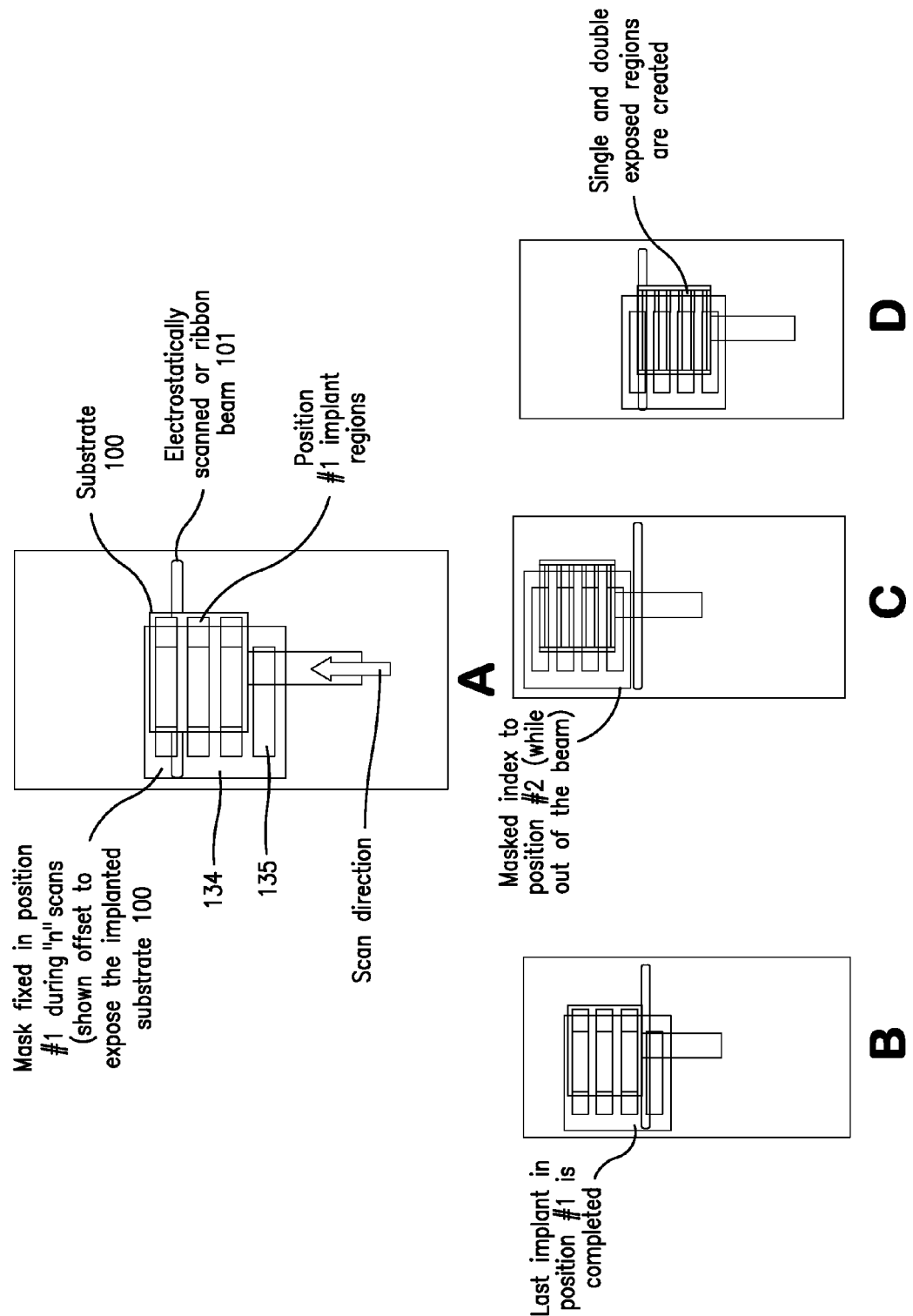
FIGS. 10A-D illustrate as second sequential scanning method.

As mentioned above, the translation between the mask and the substrate may be in either the horizontal (lateral) direction, or the vertical direction. FIGS. 10A-D illustrate a second sequential scanning method. FIG. 5 shows an embodiment in which the mask 104 was indexed in a direction perpendicular to the scan direction (i.e. laterally). This caused the mask to create implanted regions consisting of horizontal stripes. In this scanning method, the mask 134 is moved in a direction parallel to the scan direction (i.e. vertically). The mask 134 is positioned in front of a substrate 100 and indexed to a new position after a predetermined number of implant passes. The apertures 135 of the mask 134 and the indexing distances are designed such that areas of the substrate 100 requiring a higher dose than other areas of the substrate 100 are exposed a second time to the ion beam 101. FIG. 10A shows the mask 134 in a first position relative to the substrate 100. After the implant has been completed, the mask 134 is moved relative to the substrate 100, such as vertically, as shown in FIG. 10C. The mask 134 and substrate 100 are then moved in line with the ion beam 101 so as to implant the substrate 100 in this second position, as shown in FIG. 10D. Any regions of the substrate 100 that are exposed in both the first and second positions will receive a double exposure of ions.

In other words, the mask can be moved in either the vertical or horizontal direction relative to the substrate 100, depending on the type of mask, and the desired implant pattern.

Figure 11:
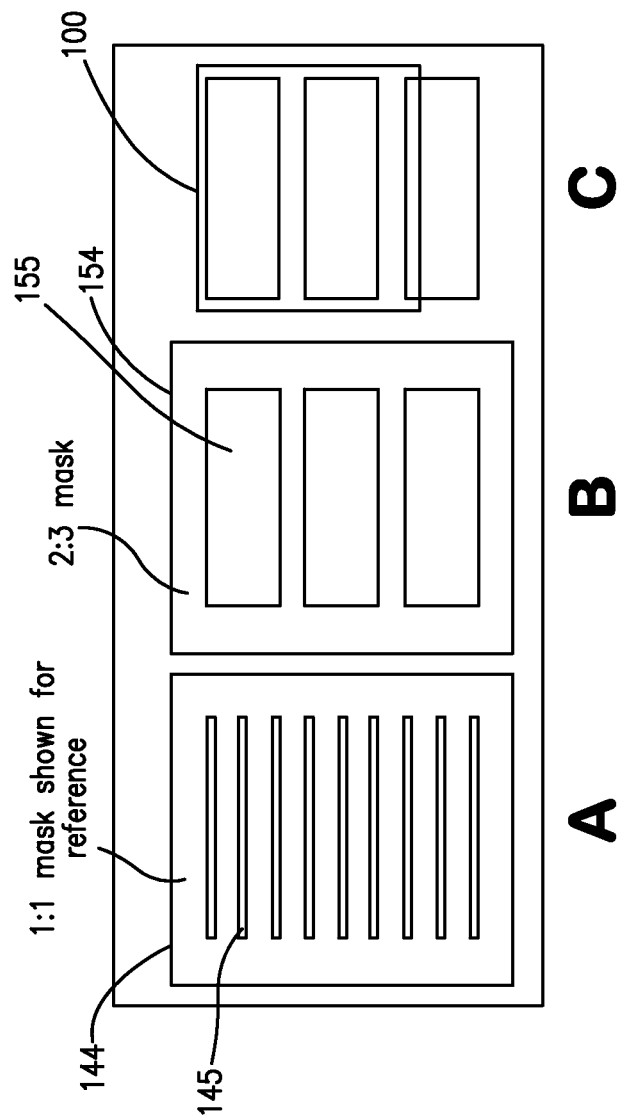
FIGS. 11A-F are a comparison of masks and resulting implant regions.

FIGS. 11A-E are a comparison of masks and resulting implant regions. The mask 144 in FIG. 11A is a mask 144 with a 1:1 mask-to-span ratio. The mask 154 in FIG. 11B has an aperture 155 that spans the width of three rows of apertures 145 in the mask 144 of FIG. 11A. Other variations to the aperture size, shape, and width are possible. The mask 154 of FIG. 11B may be stepped or indexed to three different positions to complete an implant of a solar cell in one particular embodiment. FIG. 11C is the resulting implant in the substrate 100 using the mask 154 of FIG. 11B after only one of the three different implant positions. FIG. 11D shows a different representation of the implant pattern. This figure represents a vertical cross-sectional view of the substrate 100. All regions of the substrate 100 are implanted, except those directly below the mask 154, between adjacent apertures 155. The implanted regions 152 are shown as cross-hatched regions. FIG. 11D shows the resulting implant after one of the implant positions (i.e. FIG. 11C). FIG. 11E shows the resulting implant in the substrate 100 using mask 154 of FIG. 11B after two implant steps. The implant steps performed during the first step are shown as white regions 153, while the new implants are denoted by cross hatch regions 152. Since the mask 154 has been translated upward, the regions that are implanted 152 do not align with the previous implanted regions 153, thereby creating regions that have been implanted two times, and others that have been implanted only once. FIG. 11F shows the resulting implant in the substrate 100 using mask 154 of FIG. 11B after three implant steps have been completed. Again, the implant steps performed during the first two steps are shown as white regions 153, while the new implants are denoted by cross hatch regions 152. Regions 159 have been implanted during all three implant steps, while the other regions are only implanted during exactly 2 of the 3 implant steps. Thus, this mask pattern and indexing distance creates a substrate where some regions receive a dose that is equal to ⅔ of the maximum dose received by other regions 159.

Figure 16:
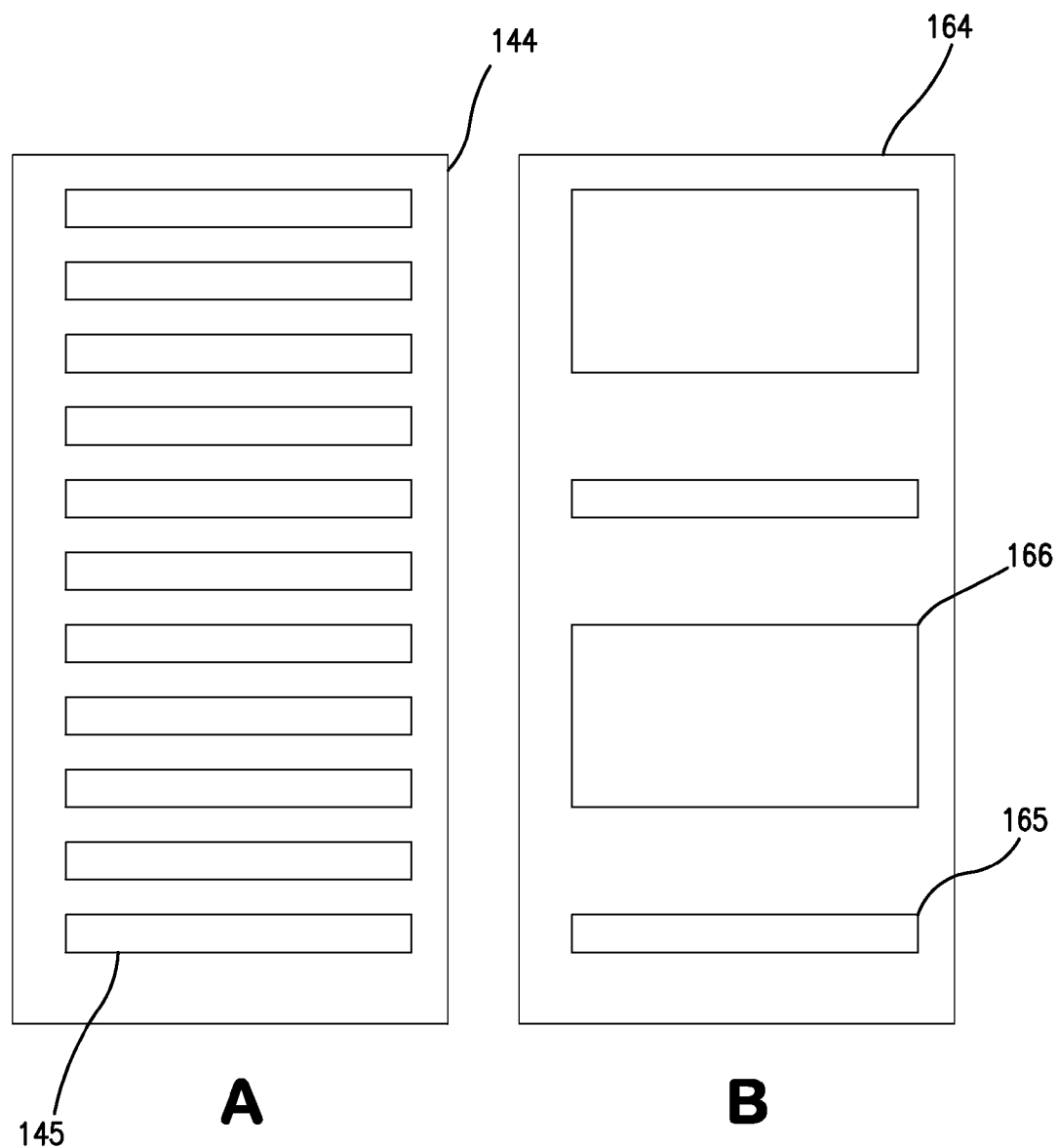
FIG. 16A-E are an embodiment of another mask and the resulting implant regions.

In this example, the width of the heavier implanted regions 159, the indexing distance and the separation distance (the spacing between apertures) are nearly the same. However, this is not a requirement. In fact, the separation distance need not be constant. Additionally, the size of each aperture can vary as desired. FIG. 16A shows a mask 144 with a 1:1 segment-shadow ratio. FIG. 16B shows a mask 164 where the separation distance is roughly equal to three times the aperture opening 165. However, the resulting heavily implanted regions 167 (see FIG. 16E) are much narrower than the separation distance. In this embodiment, three implant steps are used to create a pattern where the heavily implanted regions 167 receive three times the dose of the other regions. The mask in FIG. 16A is a mask 144 with a 1:1 mask-to-span ratio. The mask 164 in FIG. 16B has an aperture 165 that spans the width of one aperture in the mask 144 of FIG. 16A. The mask 164 in FIG. 16B also has an aperture 166 that spans the width of three rows of apertures in the mask 144 of FIG. 11A. The separation distance between adjacent apertures 165, 166 also spans one row of apertures 145. Other variations to the aperture size, shape, and width are possible. FIG. 16C is a vertical cross-sectional representation of the resulting implant in the substrate 100 using the mask 164 of FIG. 16B after only one of the three different implant positions. The regions implanted during this step are shown as cross-hatched regions 162. FIG. 16D shows the resulting implant in the substrate 100 using mask 164 of FIG. 16B after two implant steps. The first implant step is shown as white regions 163, while the new implant is shown in cross hatch regions 162. FIG. 16E shows the resulting implant in the substrate 100 using mask 164 of FIG. 16B after three implant steps have been completed. Regions 167 have been implanted during three implant steps, while the other regions are only implanted during exactly 1 of the 3 implant steps.

The stepped mask concept is not limited to masks with stripe-shaped apertures. FIGS. 12A-B are embodiments of a mask 174 with its resulting implant patterns. Many different patterns may be implanted into a substrate by designing a mask to create the appropriate overlap regions. Heavily dosed features may be made discrete and the pattern may be repeated to at least some extent. In the embodiment of FIGS. 12A-B, the stepped mask 174 pattern creates a grid-like pattern on the substrate 100. The apertures 175 in this case have no overlap except for the small indentations 176. These indentation areas 176 are implanted twice and form a grid on the substrate 100. FIG. 12B is the resulting implant pattern in the substrate 100 after the mask 174 is moved to a second position. Some regions of the substrate 100 (the indentation areas) are implanted with a higher dose than other regions of the substrate 100.

FIGS. 17A-E represent a mask 284 and the corresponding implants. FIG. 17A shows the mask 284, which has apertures 285. FIG. 17B shows the implant pattern after the mask 284 has been used for one step. After this step is completed, the mask 284 is moved relative to the substrate 100 toward the right, and a second implant is performed. FIG. 17C shows the resulting implant pattern after two implants have been performed. Note that this movement of the mask 284 creates horizontal stripes 286 having non-uniform doping concentrations. The mask 284 is then shifted vertically downward and another implant is performed. FIG. 17D shows the resulting pattern after three implants. The mask 284 is then shifted to the left and a fourth implant is performed. The resulting pattern has a blanket implant on the entire substrate 100, with additional doping in a cross-like pattern, as heavier doped regions 287 form both horizontal and vertical stripes on the substrate.

Figure 1:
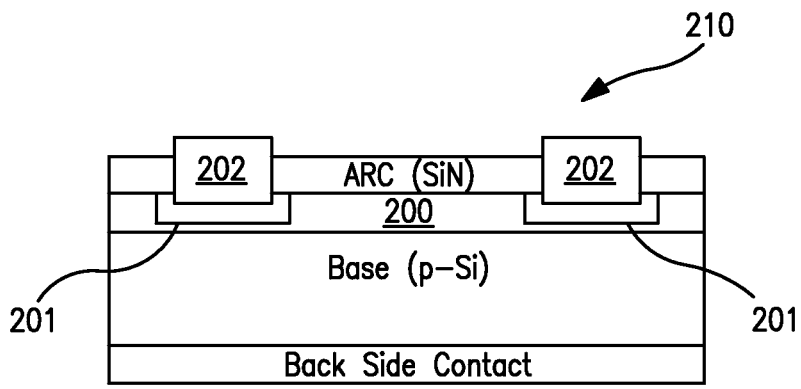
FIG. 1 is a cross-sectional view of a selective emitter solar cell.
Figure 2:
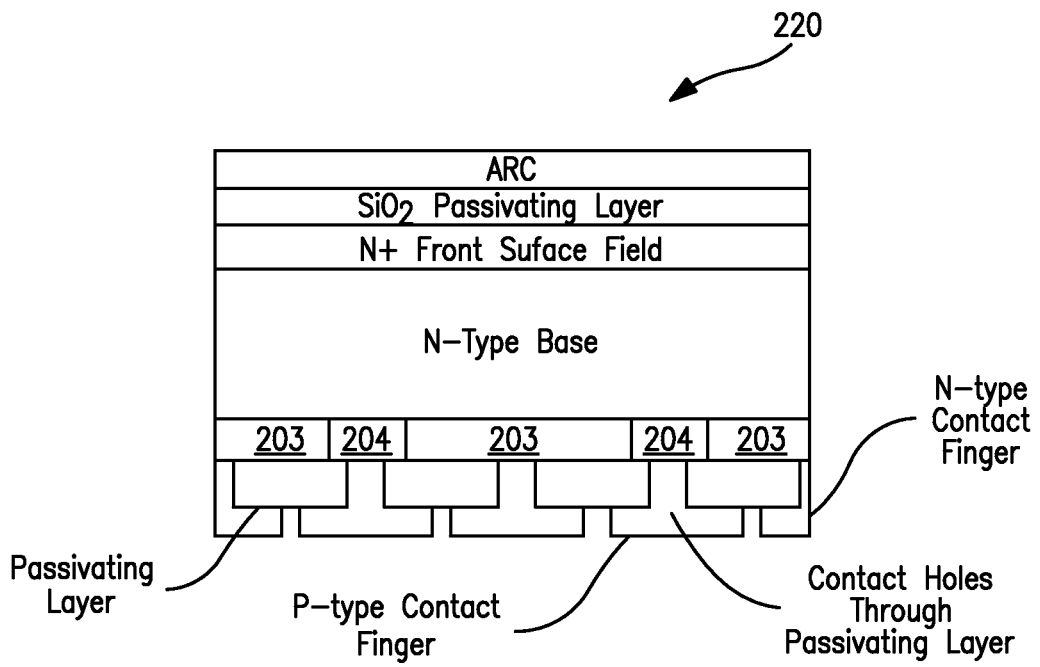
FIG. 2 is a cross-sectional view of an interdigitated back contact solar cell.

FIGS. 13A-C are an embodiment of a stepped mask and resulting implant pattern. For ease of understanding, the mask 184 is shown separate from the substrate 100. The mask 184 actually would be disposed over the substrate 100 during implant as seen in FIG. 3. In this embodiment the mask 184 has three apertures 185. In FIG. 13A, the mask 184 is in a first position and an implant is performed. This results in first implanted regions 186 in the substrate 100, which may be a solar cell. In FIG. 13B, the mask 184 moves or indexes to a second position relative to the substrate 100. In FIG. 13C, a second implant is performed. This results in second implanted regions 187 in the substrate 100. Now the substrate 100 has first implanted regions 186 and second implanted regions 187. In some portions first implanted region 186 and second implanted region 187 overlap, forming heavily doped regions 188. The heavily implanted regions 188 have approximately twice the dose of the first implanted regions 186 and second implanted regions 187 because this particular region of the substrate 100 received two implants. Of course, other doses are possible. While the first implanted regions 186 are shown separated by lines, the various implant regions may cause the first implanted regions 186 to abut one another without a gap between or have a slight overlap like the heavily implanted regions 187. A small gap may exist between the first implanted regions 186, however, due to the mechanics of the implant and mask 184 indexing. The heavily implanted regions 187 may correspond to, for example, the regions 201 under the contacts 202 in FIG. 1 and the first and second implanted regions 186,187 may correspond to, for example, the emitter 200 in FIG. 1.

The use of a stepped mask 184, such as that illustrated in FIG. 13A-C, may increase throughput. The mask 184 does not have to be removed from in front of the substrate 100. In one instance, the mask 184 and substrate 100 are removed together as a sandwich. In another instance, the mask 184 is kept in place and only the substrate 100 is removed. Use of such a stepped mask 184 also may reduce thermal load on the substrate 100 or platen 102. Stepped masks may improve tooling or reduce cost of a mask 184 because the apertures 185 are larger.

FIGS. 14A-D are an embodiment of a stepped mask implant to create heavily doped regions beneath bus-bars. FIG. 14A shows a mask 244 which may be used to create the desired implant pattern. The apertures 245 in mask 244 are irregularly shaped, having an indentation 246 along the top side of each aperture 245. FIGS. 14B-D represent a series of three implants that enable doping in the regions which will ultimately be beneath the bus-bars of a substrate 100. In one embodiment, contacts, such as the contacts 202 of FIG. 1, supply current to a larger bus-bar. Here, a mask 244 is used that creates an implant pattern illustrated on the left side of FIG. 14B. The implant pattern after one implant is shown on the right side of FIG. 14B. In this particular embodiment, the implanted regions 247 is T-shaped. FIG. 14C shows the resulting implant pattern after two implant steps have been performed. In this embodiment, the mask 244 is indexed vertically with respect to the substrate 100. Due to the indexing distance and shape of the apertures, inverted "T" shaped heavily doped regions 248 are created, which have been implanted during both implant steps. There also exist regions which have only been implanted once, and other regions that have received no implant. If this mask 244 is stepped or indexed to a third position, the resulting implant pattern is illustrated on the right-hand side of FIG. 14D. The darker regions 248 are more heavily doped than the lighter doped regions (represented by the slashed lines). Implanting under a bus-bar will reduce recombination and series resistance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a pattern into a substrate, comprising:
   placing a mask having at least one aperture between said substrate and an ion source;
   implanting ions in a first region of said substrate aligned with said aperture;
   moving said mask in a first direction relative to said substrate such that said aperture is aligned to a second region of said substrate;
   implanting ions in said second region of said substrate, whereby a portion of said first region and a portion of said second region overlap;
   moving said mask in a second direction relative to said substrate such that said aperture is aligned to a third region of said substrate, wherein said second direction is perpendicular to said first direction; and
   implanting ions in said third region of said substrate, whereby a portion of said third region and a portion of said second region overlap.

2. The method of claim 1, wherein said aperture has a width less than a width of said substrate.

3. The method of claim 1, further comprising:
   moving said mask in said second direction relative to said substrate such that said aperture is aligned to a fourth region of said substrate; and
   implanting ions in said fourth region of said substrate, whereby a portion of said fourth region and a portion of said third region overlap.

4. The method of claim 1, wherein said implanting forms a grid of heavily-implanted areas that are formed on a surface of said substrate, wherein said surface between said heavily-implanted areas is implanted less than said heavily-implanted areas.

5. The method of claim 4, wherein said surface between said heavily-implanted areas is implanted to a level greater than zero.

6. The method of claim 1, wherein said implanting forms a pattern having horizontal stripes connected by at least one vertical stripe.

7. The method of claim 1, wherein said first direction is horizontal and said second direction is vertical.

8. The method of claim 1, wherein said mask is disposed a distance from said substrate.

9. A method of implanting a pattern into a substrate, comprising:
  placing a mask having at least one aperture between said substrate and an ion source;
  implanting ions in a first region of said substrate aligned with said aperture;
  moving said mask in a first direction relative to said substrate such that said aperture is aligned to a second region of said substrate;
  implanting ions in said second region of said substrate, whereby a portion of said first region and a portion of said second region overlap;
  moving said mask in a second direction relative to said substrate such that said aperture is aligned to a third region of said substrate, wherein said second direction is perpendicular to said first direction;
  implanting ions in said third region of said substrate, whereby a portion of said third region and a portion of said second region overlap;
  moving said mask in said second direction relative to said substrate such that said aperture is aligned to a fourth region of said substrate; and
  implanting ions in said fourth region of said substrate, whereby a portion of said fourth region and a portion of said third region overlap.

10. The method of claim 9, wherein said aperture has a width less than a width of said substrate.

11. The method of claim 9, wherein said implanting forms a grid of heavily-implanted areas that are formed on a surface of said substrate, wherein said surface between said heavily-implanted areas is implanted less than said heavily-implanted areas.

12. The method of claim 11, wherein said surface between said heavily-implanted areas is implanted to a level greater than zero.

13. The method of claim 9, wherein said implanting forms a pattern having horizontal stripes connected by at least one vertical stripe.

14. The method of claim 9, wherein said first direction is horizontal and said second direction is vertical.

15. The method of claim 9, wherein said mask is disposed a distance from said substrate.

16. A method of implanting a pattern into a substrate, comprising:
  placing a mask having at least one aperture between said substrate and an ion source;
  moving said mask in a first direction and a second direction perpendicular to said first direction such that multiple regions of said substrate are exposed through said aperture, wherein each of said multiple regions overlaps with another of said multiple regions; and
  implanting ions into said multiple regions during a plurality of implant steps to form a grid of heavily-implanted areas that are implanted more than a surface of said substrate between said heavily-implanted areas.

17. The method of claim 16, wherein said aperture has a width less than a width of said substrate.

18. The method of claim 16, wherein said first direction is horizontal and said second direction is vertical.

19. The method of claim 16, wherein said mask is disposed a distance from said substrate.

20. The method of claim 16, wherein said surface between said heavily-implanted areas is implanted to a level greater than zero.

* * * * *